US006469418B1

(12) United States Patent
Katerberg et al.

(10) Patent No.: US 6,469,418 B1
(45) Date of Patent: Oct. 22, 2002

(54) VIBRATION MONITORING SYSTEM AND METHOD

(75) Inventors: James A. Katerberg, Kettering, OH (US); Joseph P. Cleary, Kettering, OH (US)

(73) Assignee: Scitex Digital Printing, Inc., Dayton, OH (US)

( * ) Notice: Subject to any disclaimer, the term of this patent is extended or adjusted under 35 U.S.C. 154(b) by 0 days.

(21) Appl. No.: 09/893,111

(22) Filed: Jun. 27, 2001

(51) Int. Cl.[7] ................................................ H01L 41/08
(52) U.S. Cl. .................................. 310/316.01; 310/317
(58) Field of Search ............. 318/116–118; 310/316.01, 310/316.02, 317, 319

(56) References Cited

U.S. PATENT DOCUMENTS 5,886,483 A * 3/1999 Nogarede et al. ........... 318/116
6,084,363 A * 7/2000 Mizumoto .................. 318/116
6,183,426 B1 * 2/2001 Akisada et al. ................ 601/2
6,278,220 B1 * 8/2001 Furukoshi et al. ..... 310/316.02

* cited by examiner

*Primary Examiner*—Mark O. Budd
(74) *Attorney, Agent, or Firm*—Barbara Joan Haushalter

(57) ABSTRACT

A differential circuit is used to compare the current to the drive transducers to a matched reference circuit. With the capacitive current from the piezoelectric transducer canceled out in this manner, the resulting output current provides a direct measure of the vibration amplitude of the drop generator. By adding an appropriate inductor in parallel to the capacitive piezoelectric drive transducers, the loading of the drive electronics, or oscillator, is significantly reduced.

16 Claims, 6 Drawing Sheets

VIBRATION MONITORING SYSTEM AND METHOD

TECHNICAL FIELD

The present invention relates to vibration monitoring and more particularly to monitoring the stimulation in any ultrasonic generator.

BACKGROUND ART

Vibration monitoring is useful in multiple systems and industries. Ultrasonic generators, including ultrasonic cleaners, ultrasonic welders, ultrasonic machining, and continuous ink jet drop generators, are used for a variety of purposes. For example, in order to provide precise charging and deflection of drops in a continuous ink jet printer, it is important that the drop break-up process produce uniformly sized and timed drops. Drop generators for such printers produce the required drop formation by vibrating the orifices from which the ink emerges.

Feedback transducers have been utilized for control of the stimulation amplitude and for tracking the resonance of the drop generator as discussed in U.S. Pat. No. 5,384,583, totally incorporated herein by reference. These feedback transducers work appropriately when the feedback signal has sufficient signal to noise. The use of a push-pull feedback system as discussed in that disclosure can effectively suppress noise due to charging transients or due to electronic coupling from the stimulation drive signal.

The individual transducers can be placed close to each other so that the noise picked up by the two transducers are similar, allowing the noise to be canceled. Proper placement of the individual transducers can help suppress output signals from extraneous vibrational modes.

However, for some drop generator designs, it is not practical to place the transducer appropriately to suppress all the other extraneous modes. This might be a result of insufficient space to place the feedback transducers, or low output amplitudes on available surface space. For some drop generator designs, to effectively suppress the detection of extraneous modes would require placement of feedback transducers in the space already occupied by the drive transducers. This results from the need to place drive transducers in a particular pattern to suppress the exciting of undesirable modes.

For such systems it would be desirable to employ the driving transducers as feedback transducers as well. While U.S. Pat. No. 3,868,698 makes use of the drive transducer impedance characteristics to track resonant frequency, it does not teach a means to monitor the vibration amplitude and phase for use in the control of the ink jet system.

It would be desirable to have an effective means to employ the piezoelectric drive crystals for both driving the drop generator and detecting the resulting vibration. Additionally, the large capacitance of piezoelectric drive transducers, when operated at high frequencies, can provide significant loading to the drive electronics. This can significantly limit the maximum drive amplitudes. It would, therefore, be desirable to have a means to allow for higher drive amplitudes, even with large capacitance levels of drive transducers.

SUMMARY OF THE INVENTION

The present invention provides a means, such as a circuit, which uses the driving piezoelectric transducers to monitor the induced vibration or stimulation in an ultrasonic generator, such as the drop generator of an ink jet printing system. The present invention finds utility not just in the field of ink jet printing, but in other fields including monitoring ultrasonic cleaners and welders.

In accordance with one aspect of the present invention, a differential circuit is used to compare the current to the drive transducers to a matched reference circuit. With the capacitive current from the piezoelectric transducer canceled out in this manner, the resulting output current provides a direct measure of the vibration amplitude of the drop generator. By adding an appropriate inductor in parallel to the capacitive piezoelectric drive transducers, the loading of the drive electronics is significantly reduced.

Other objects and advantages of the invention will be apparent from the following description and the appended claims.

DETAILED DESCRIPTION OF THE INVENTION

The present invention uses a method for monitoring the stimulation amplitude that makes use of the sensor equation for piezoelectric transducers:

$$\Theta^T * r = q - C_p * v$$

where, $\Theta^T$ is the piezoelectric coupling matrix; q is the charge produced by or supplied to the piezoelectric transducer; $C_p$ is the clamped capacitance of the piezoelectric; and v is the time derivative of the voltage. The value r is the strain in the piezoelectric, corresponding to the displacement at the transducer. The clamped capacitance term, $C_p$*v, corresponds to the charge supplied to the capacitance of the transducer, which is independent of the motion of the piezoelectric.

From the above equation, it is seen that if the clamped capacitance term could be eliminated from the right side of the equation, then the current would be directly proportional to the velocity. To accomplish this, the circuit of FIG. 1 is proposed.

Figure 1:
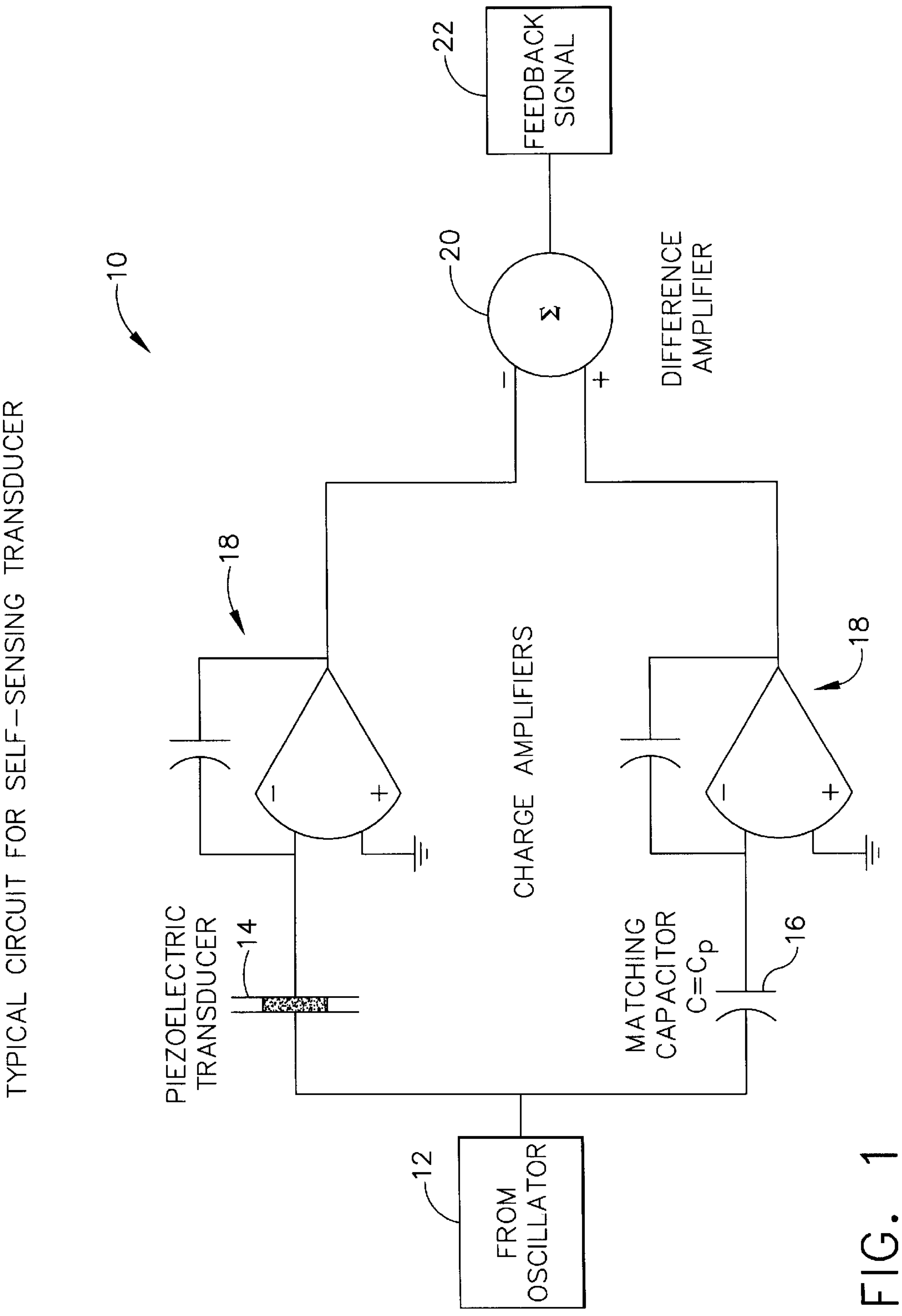
FIG. 1 illustrates a prior art circuit for a self-sensing transducer.

As shown in the prior art circuit 10 of FIG. 1, the drive signal 12 from the oscillator is supplied both to the piezoelectric transducer 14 and to a matching capacitor 16, whose capacitance equals the clamped capacitance of the piezoelectric transducer. On the ground side of the piezoelectric transducer and the matching capacitor are matched amplifiers 18. The matched charge amplifiers each produce a voltage output which is proportional to the charge on the input piezoelectric or capacitor. Since the capacitance of the matching capacitor has been set equal to the clamped capacitance of the piezoelectric, the charge on the matching capacitor will equal the charge on the piezoelectric due to the clamped capacitance. As the charge on the matching capacitor will equal the charge on the piezoelectric due to the clamped capacitance, the voltage out of the lower charge amplifier will equal the voltage out of the upper amplifier produced by the clamped capacitance term of the sensor equation. The output from the difference amplifier 20, therefore, has removed the effect of the clamped capacitance, yielding an output which is directly proportional to the displacement produced by the transducer.

While this sensor actuator circuit 10 provides the desired output, to be used as a feedback signal 22, it has some shortcomings. First, when used for the stimulation drive system, the inputs for each of the charge amplifiers will have to handle quite a large amount of current. Obtaining the desired operational amplifiers which can handle the current can be difficult. Second, the circuit monitors the current on the ground side of the transducers. For a drop generator, this would require either that the piezoelectrics be isolated from the drop generator or that the drop generator be isolated from the rest of the printhead. Since electrically isolating the piezoelectrics from the drop generator can have a negative effect on the acoustic coupling, this would imply electrically isolating the drop generator. Third, requiring the drop generator to be grounded by the feedback circuit forces the drop charging current to flow through this circuit. The charging current would therefore also be amplified by the amplifiers. As the charging current would be expected to have an AC component at the stimulation frequency, this noise signal could not be readily filtered out. The resulting feedback signal would be modulated in conjunction with the print-catch duty cycle of the printhead. Fourth, since the drive signal must be supplied not only to the piezoelectric transducer but also to the matching capacitor, the drive electronics has an increased current load.

The problems associated with the typical circuit for self-sensing actuators can be overcome by a transformer system proposed by the present invention. Referring to FIGS. 2–5, transformer circuit embodiments in accordance with the present invention are illustrated. In circuits 24, 26, 28 and 30, the drive voltage is supplied to both the drop generator and a matching capacitor. Transformers in the drive lines for both the piezoelectric and the matching capacitor couple the drive currents to their secondaries. The current produced in the secondaries flows through the resistors on the secondaries to produce a voltage across each proportional to the current. By reversing the secondary for the matching capacitor leg of the circuit, reversing the current in the secondary, and connecting the resistors in series, the desired output can be obtained which is proportional to the velocity seen by the piezoelectric transducers.

The transformer circuits of the present invention, therefore, eliminate the problem of needing to sink a lot of current into operational amplifiers. These transformer circuits also allow for the circuit to be moved from the ground side of the transducers to the drive side of the transducers. This eliminates the problems associated with attempts to electrically isolate the drop generator, and the problem of drop charging current being monitored and coupled into the stimulation feedback system.

Figure 2:
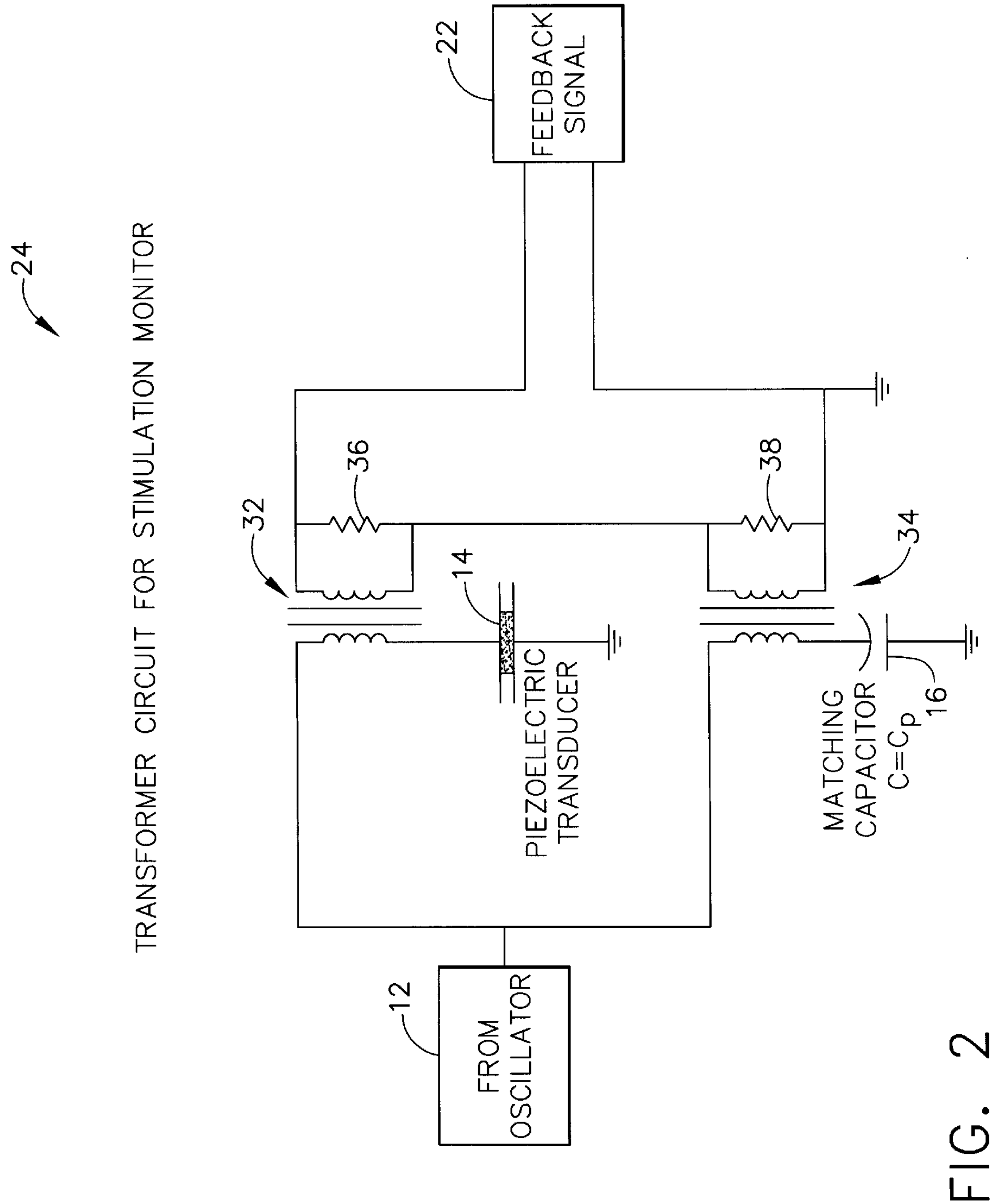
FIG. 2 illustrates a transformer circuit for stimulation monitoring, in accordance with the present invention.

In addition to having a capacitor 16 which is matched to the clamped capacitance of the piezoelectric 14, the circuit 24 of FIG. 2 requires the two transformers 32, 34 and the resistors 36, 38 to be matched. This circuit, however, still has the problem of loading the stimulation drive circuit. A second potential problem is the power drop through the resistors on the secondaries.

Figure 3:
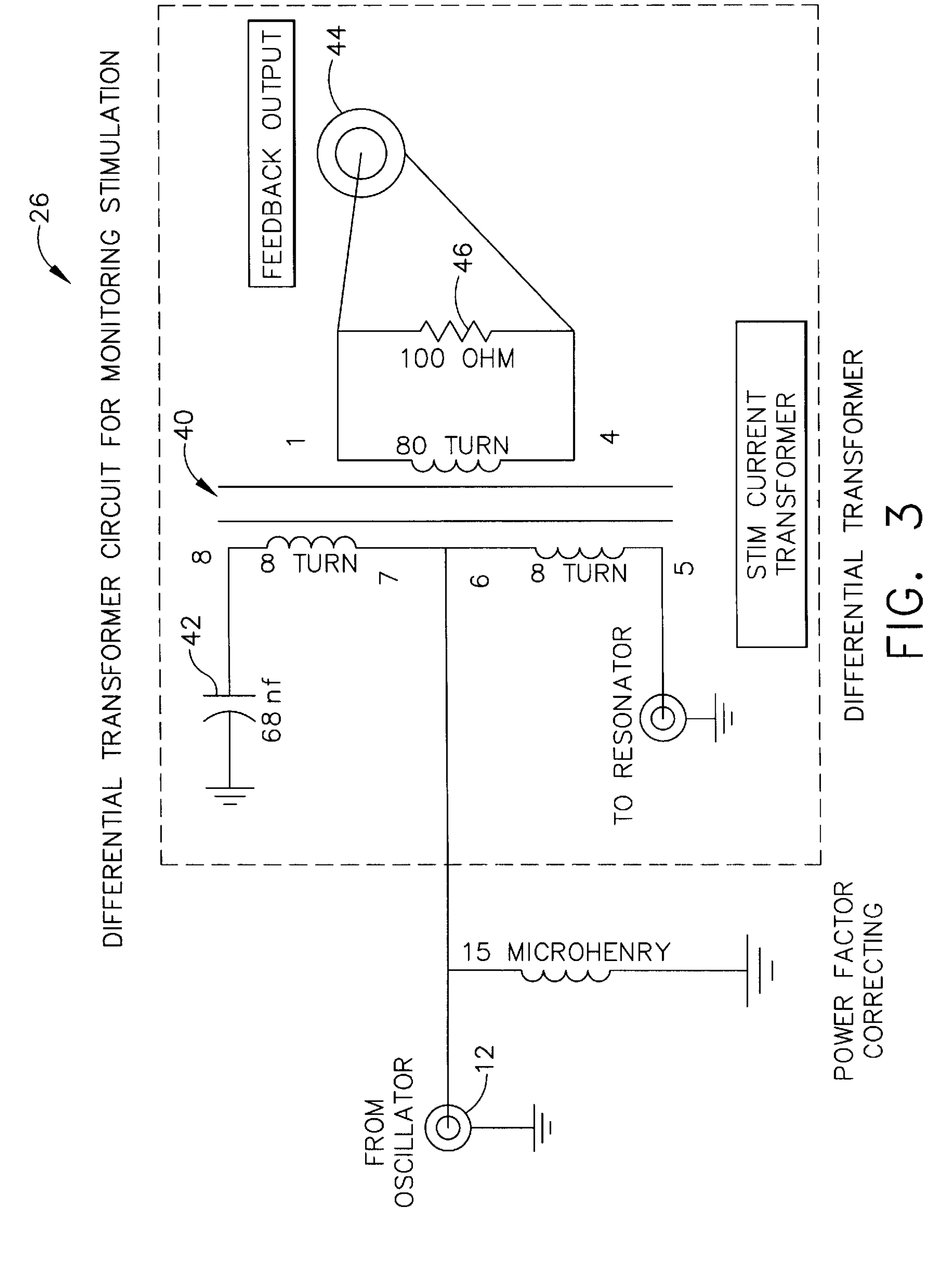
FIG. 3 illustrates a differential transformer circuit for stimulation monitoring, in accordance with the present invention.

Therefore, the present invention proposes an alternative transformer circuit 26, illustrated in FIG. 3. The differential transformer circuit of FIG. 3 eliminates problems that may be encountered with the circuit 24 of FIG. 2. In FIG. 3, the differential transformer circuit uses a three leg transformer 40. The drive signal is supplied to the two primary legs of the transformer. These are connected in turn to the piezoelectric transducer 14 and the matching capacitor 42. The primary for the matching capacitor 42 leg is reversed so that if the current to the two primary windings are matched, there will be no current induced in the secondary. If the current to the piezoelectric transducer differs from that to the matched capacitor, the current in the output leg of the transformer will be proportional to the current difference of the primaries. The output current produces a voltage across the resistor 46, which is seen at the output 44. Since only a current related to the current difference is produced in the secondary, the power dumped into the resistor 46 is reduced. In this figure, the piezoelectric transducer had a clamped capacitance of about 68 nf.

The circuit in FIG. 3, makes use of a ten-to-one step up transformer 40. The use of step up transformers is useful not only for increasing the output amplitude but also for stepping down the impedance seen in the primary leg of the transformers as a result of the resistance across the secondary. With the ten to one step up transformer, the 100 ohm resistor on the secondary produces only one ohm of impedance on the primaries.

Continuing with FIG. 3, to reduce the current load on the oscillator, the circuit 26 includes an inductor 48 for power factor correction. The proper inductance value for a desired operating frequency can be obtained from an analysis of the circuit impedance. The inductance for which the imaginary term of the circuit impedance is zero at the operating frequency yields the desired power factor correction. With the appropriate inductance, the capacitive current seen by the drive source can be reduced. As a result, the loading of the drive source is reduced.

While the preferred embodiment of this stimulation monitor includes the power factor correcting inductor to reduce the current load on the drive circuit, the differential transformer system can be used without this feature. This may be preferred where the capacitances are low, or where system is to be operated over a large frequency range.

The output from differential transformer circuit 26 tracks the amplitude and phase of the vibrational velocity as the drive frequency and the ultrasonic loading of the drop generator are changed. A comparison of the output from the differential transformer is made with that from a push-pull feedback system, such as is disclosed and claimed in U.S. Pat. No. 5,384,583, totally incorporated herein by reference, on the same drop generator, shows approximately 10 db higher from the differential transformer circuit than from a push-pull feedback system. Since the differential transformer circuit output is derived from the current going to all the drive crystals, it tends to suppress the detection of resonances which are not uniform down the length of the array. As a result, output gain and phase plots can show that the differential transformer is more successful at suppressing the detection of extraneous modes than push-pull feedback systems of the prior art.

Figure 4:
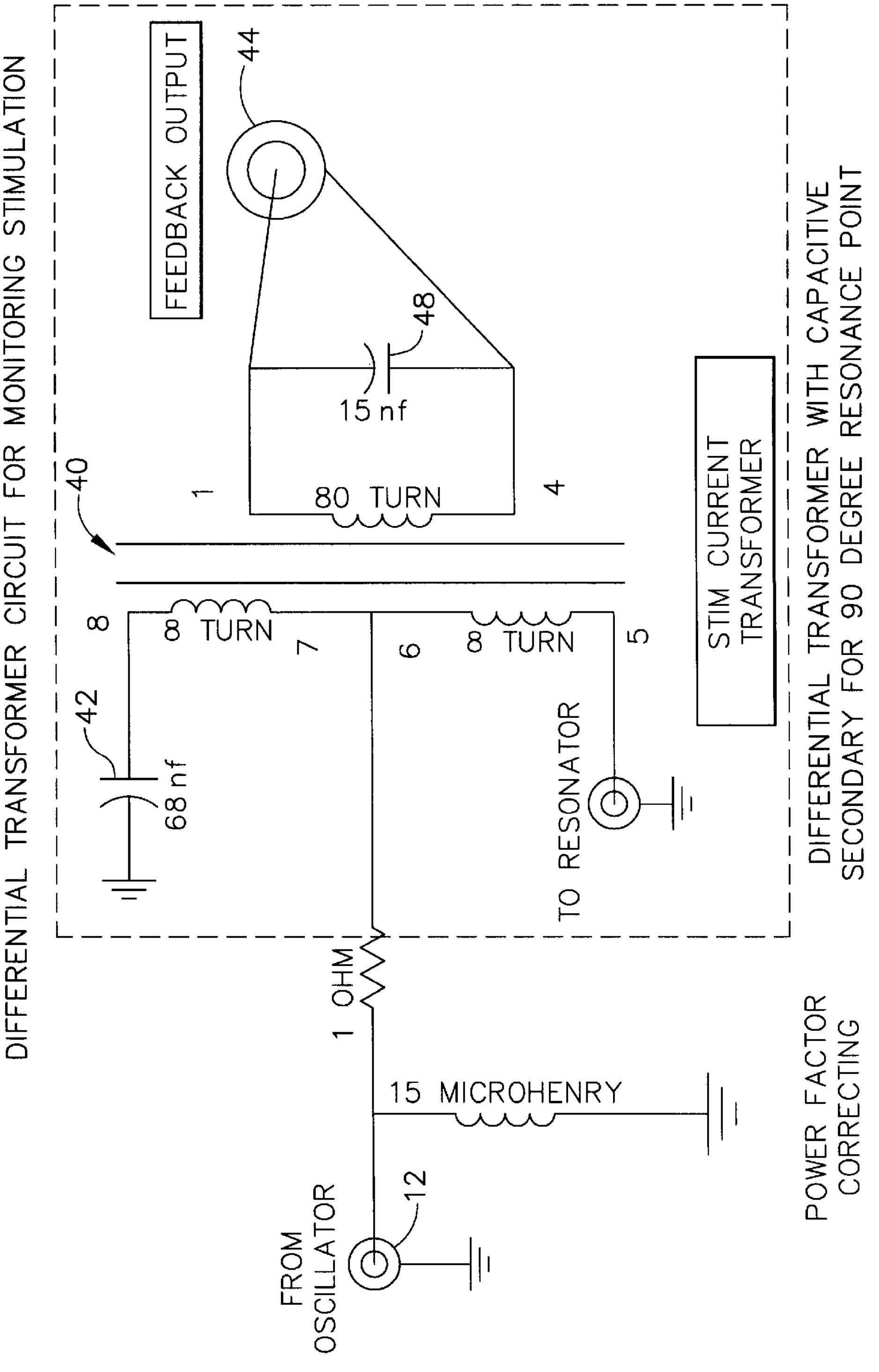
FIG. 4 illustrates an alternative embodiment of a differential transformer circuit for stimulation monitoring, in accordance with the present invention.

The differential transformer circuit of FIG. 3 provides an output which tracks the velocity at the piezoelectric transducer. If desired, the circuit can be made to track displacement. This can be accomplished by replacing the resistor 46 across the transformer secondary, in FIG. 3, with a capacitor 48, as shown in FIG. 4. This circuit 28 will produce a 90° phase shift between the drive signal and the feedback signal at the mechanical resonance of the transducer. The circuit of FIG. 3, on the other hand, produces a 0° phase shift between the drive signal and the feedback signal at the mechanical resonance of the transducer. The choice between these two circuits is based on the design of the control circuit, which will use the output from this vibration monitoring circuit.

Figure 5:
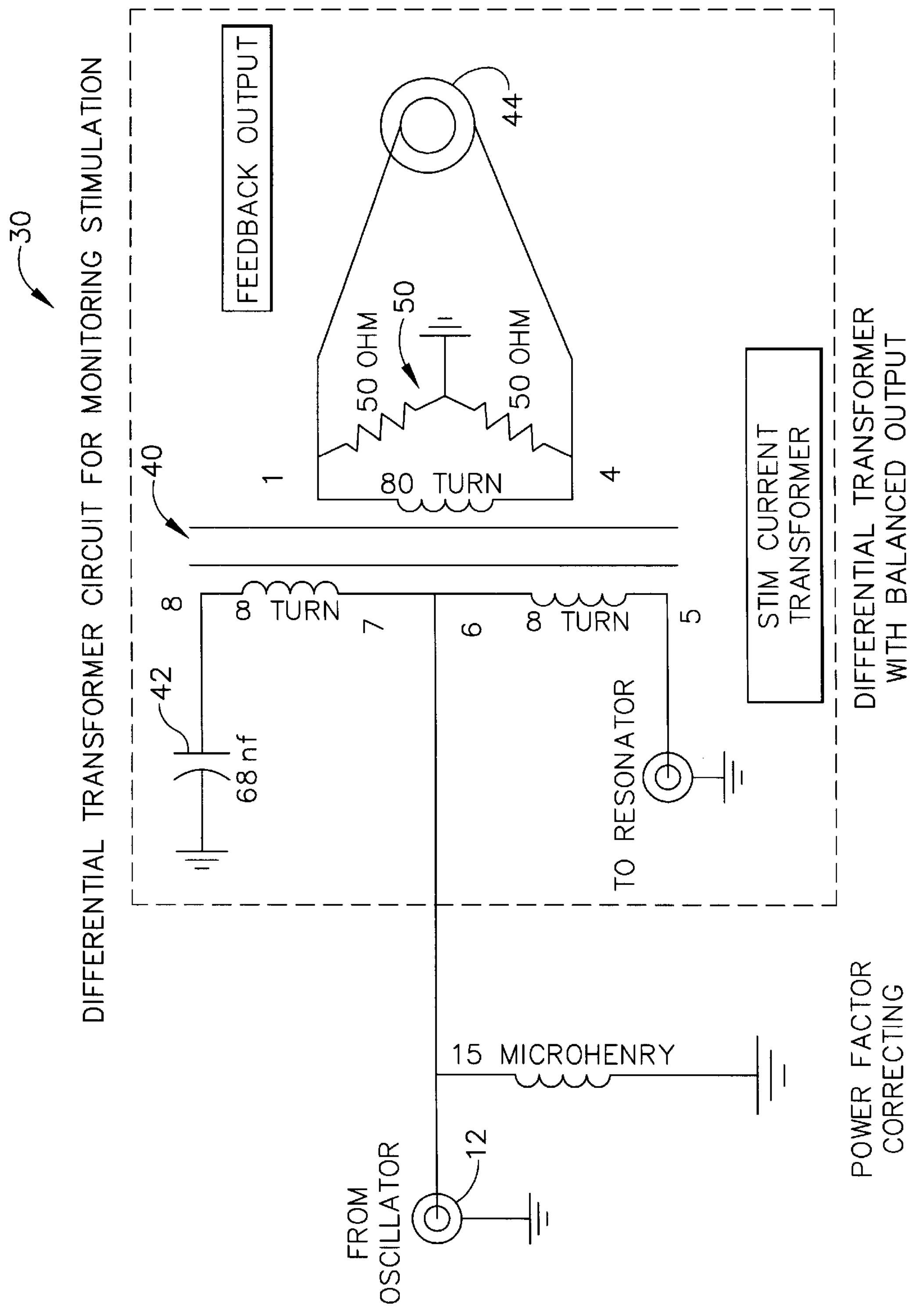
FIG. 5 illustrates yet another alternative embodiment of a differential transformer circuit for stimulation monitoring, in accordance with the present invention.

For some applications it is desirable for issues of noise pick up to provide a balanced output from the monitoring circuit. FIG. 5 shows such a push-pull configuration 50, symmetric around ground.

Figure 6:
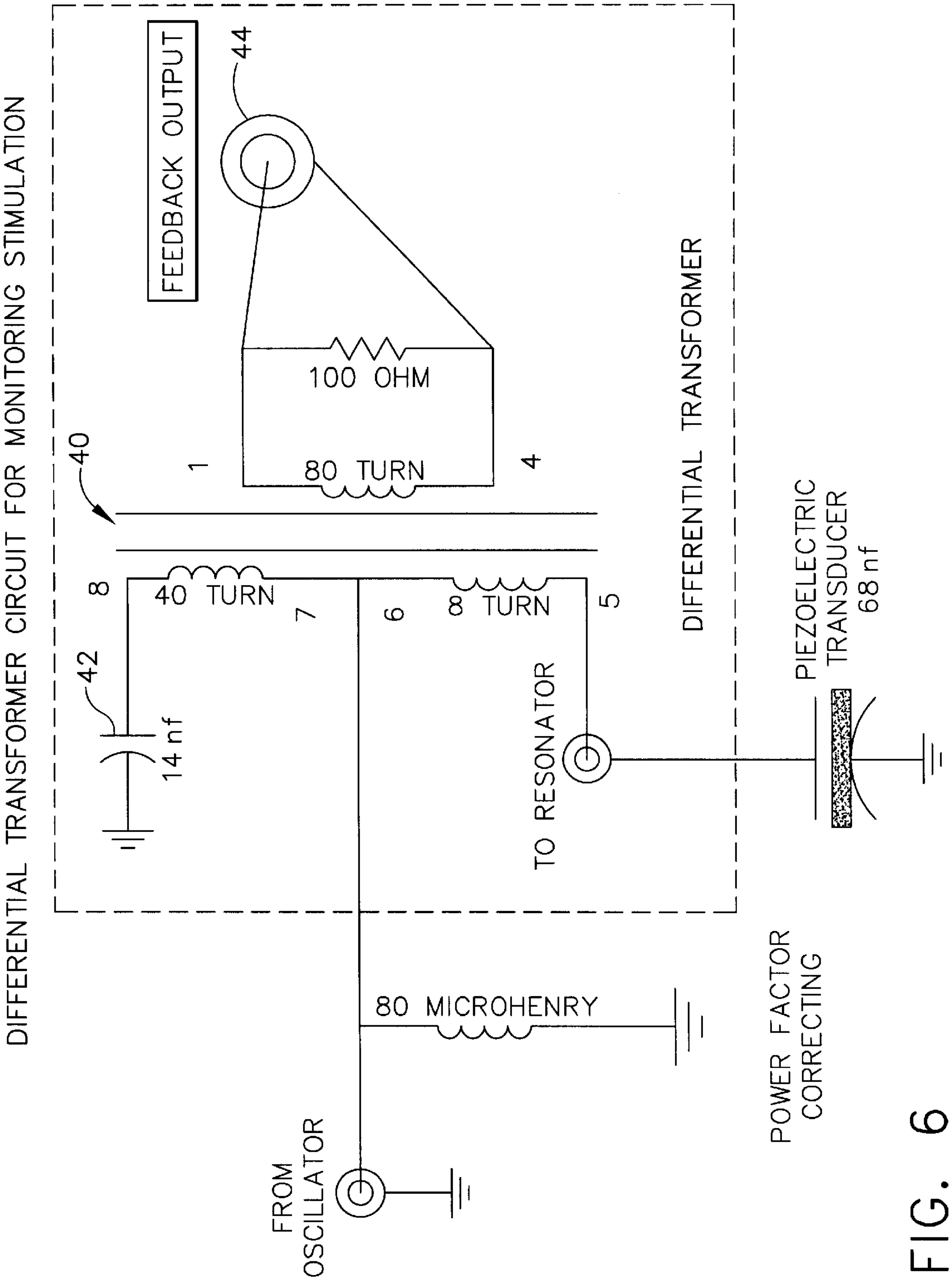
FIG. 6 illustrates yet another alternative embodiment of a differential transformer circuit for stimulation monitoring, in accordance with the present invention.

The vibration monitoring circuits shown above all use capacitors matched to the clamped capacitance of the piezoelectric transducer. FIG. 6 shows an alternate embodiment in which the turns ratio of the two primaries are no longer one to one. This allows the capacitance of the matching capacitor to be scaled by the primary turns ratio relative to the clamped capacitance of the piezoelectric transducer. This can be useful allow smaller, more convenient matching capacitors to be used. The reduced current requirements to the transformer circuit may also reduce or eliminate the need for the power factor correcting inductor 48.

The concept of transformer circuits, particularly differential transformer circuits illustrated herein, is particularly useful for monitoring the vibration amplitude in drop generators for continuous ink jet printers. However, the circuits taught herein are also useful for monitoring the vibration amplitude in many other piezoelectrically driven vibrating systems. Such systems include ultrasonic welders and ultrasonic cleaners. For both these applications, the circuit can provide the amplitude and phase information that is desirable for locking the drive frequency onto resonance and for servo controlling the amplitude of vibration. In general, this vibration monitoring circuit is preferred over the prior art for those applications where significant amounts of power are supplied to the piezoelectric transducers to produce a vibration. It is also preferred where it is not desirable or possible to insert the monitoring circuit on the ground side of the transducer.

The invention has been described in detail with particular reference to certain preferred embodiments thereof, but it will be understood that modifications and variations can be effected within the spirit and scope of the invention.

What is claimed is:

1. A method for monitoring the ultrasonic amplitude of an ultrasonic generator, comprising the steps of:

employing piezoelectric drive crystals to drive the ultrasonic generator, the drive crystals having an associated oscillator;

using at least one transformer circuit to compare current to the drive crystals to a matched reference circuit;

using the comparison to cancel capacitive current from the piezoelectric drive crystals, whereby a resulting output signal provides a direct measure of the ultrasonic amplitude of the ultrasonic generator.

2. A method as claimed in claim 1 wherein the at least one transformer circuit comprises a differential transformer.

3. A method as claimed in claim 2 wherein a capacitor is placed across a secondary of the differential transformer to provide an output signal that is directly related to vibrational displacement of the ultrasonic generator.

4. A method as claimed in claim 2 wherein a resistor is placed across a secondary of the differential transformer to provide an output signal that is directly related to vibrational velocity of the ultrasonic generator.

5. A method as claimed in claim 2 wherein two primary windings of the differential transformer are matched.

6. A method as claimed in claim 2 wherein a secondary winding of the differential transformer provides a step up relative to primary windings of the differential transformer.

7. A method as claimed in claim 1 further comprising the step of using a power factor correcting inductor to reduce load on the oscillator.

8. A method as claimed in claim 1 further comprising the step of adding an inductor in parallel to the at least one transformer circuit to reduce loading of the oscillator.

9. A method as claimed in claim 1 wherein the ultrasonic generator comprises a drop generator for a continuous ink jet printer.

10. An improved vibration monitoring system for an ultrasonic generator, the system comprising:

piezoelectric drive crystals to drive the ultrasonic generator, the drive crystals having an associated oscillator;

a differential transformer circuit for comparing current to the drive crystals to a matched reference circuit;

means for using the comparison to cancel capacitive current from the piezoelectric drive crystals, whereby a resulting output current provides a direct measure of vibration amplitude and phase of the ultrasonic generator.

11. A system as claimed in claim 10 further comprising a power factor correcting inductor to reduce load on the oscillator.

12. A system as claimed in claim 10 further comprising an inductor in parallel with the differential transformer circuit to reduce loading of the oscillator.

13. A system as claimed in claim 10 wherein the ultrasonic generator comprises a drop generator for a continuous ink jet printer.

14. A system as claimed in claim 10 wherein the ultrasonic generator comprises an ultrasonic welding horn.

15. A process for monitoring ultrasonic amplitude which comprises incorporating into an ink jet printing apparatus the system of claim 10 to monitor the ultrasonic amplitude of a drop generator.

16. A process for monitoring ultrasonic amplitude which comprises incorporating into an ultrasonic generator apparatus the system of claim 10 to monitor the ultrasonic amplitude of the generator.

* * * * *